United States Patent
Krishnamurthy et al.

(10) Patent No.: US 8,188,774 B1
(45) Date of Patent: May 29, 2012

(54) APPARATUS AND METHODS FOR ACTIVATION OF AN INTERFACE ON AN INTEGRATED CIRCUIT

(75) Inventors: Gopi Krishnamurthy, Tracy, CA (US); Binh Ton, San Jose, CA (US); Ning Xue, Fremont, CA (US); Tim Tri Hoang, San Jose, CA (US); Michael Menghui Zheng, Fremont, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 174 days.

(21) Appl. No.: 12/833,718

(22) Filed: Jul. 9, 2010

(51) Int. Cl.
*H03L 7/00* (2006.01)
(52) U.S. Cl. ......... 327/142; 327/198; 370/462; 370/463
(58) Field of Classification Search ............... 327/142, 327/198; 370/462, 463
See application file for complete search history.

(56) References Cited

U.S. PATENT DOCUMENTS

| | | | | |
|---|---|---|---|---|
| 5,321,819 | A * | 6/1994 | Szczepanek | 709/228 |
| 6,345,310 | B1 * | 2/2002 | Allison et al. | 709/250 |
| 6,373,848 | B1 * | 4/2002 | Allison et al. | 370/401 |
| 6,839,785 | B2 * | 1/2005 | Massie | 710/300 |
| 6,950,448 | B2 * | 9/2005 | Tornetta et al. | 370/537 |
| 7,414,429 | B1 | 8/2008 | Kim et al. | |
| 7,437,584 | B2 | 10/2008 | Kao | |

OTHER PUBLICATIONS

ACTEL Corporation—Live at Power-Up, PLD Effects on System Design; Aug. 2005; pp. 1-15.

* cited by examiner

*Primary Examiner* — Kenneth B. Wells
(74) *Attorney, Agent, or Firm* — Okamoto & Benedicto LLP (57) ABSTRACT

One embodiment relates to a method for activating an interface on an integrated circuit while a core of the integrated circuit is becoming operational. An offset calibration for a transceiver channel is performed by physical media attachment circuitry. A transmitting frequency is locked onto by a transmitter phase-locked loop for the transceiver channel, and a receiving frequency is locked onto by a receiver phase-locked loop for the transceiver channel. Subsequently, the interface is activated while a core component of the integrated circuit is becoming operational. Another embodiment pertains to an integrated circuit which includes transceiver channel circuits, an interface processor, and a reset control state machine. Another embodiment relates to control circuitry including a reset control state machine, transceiver channel circuits, a channel input steering multiplexer, and a channel output steering multiplexer. Other embodiments, aspects and features are also disclosed.

22 Claims, 6 Drawing Sheets

FIG. 3
(Conventional)

APPARATUS AND METHODS FOR ACTIVATION OF AN INTERFACE ON AN INTEGRATED CIRCUIT

BACKGROUND

1. Technical Field

The present invention relates generally to integrated circuits. More particularly, the present invention relates to the activation of an interface on an integrated circuit.

2. Description of the Background Art

When power is applied to a complex electronics system, integrated circuits (ICs) and other components of the system are initialized, and system startup tasks are performed. The system startup tasks may involve various components working together in an interdependent manner. For example, phase-locked loops may need to generate and distribute various clock signals to multiple system components.

SUMMARY

The present application discloses advantageous apparatus and methods so as to more quickly activate interface circuitry on an integrated circuit. Surprisingly, the interface circuitry is made ready to use prior to the integrated circuit becoming operational.

One embodiment relates to a method for activation of an interface on an integrated circuit. An offset calibration for a transceiver channel is performed by physical media attachment circuitry. A transmitting frequency is locked onto by a transmitter phase-locked loop for the transceiver channel, and a receiving frequency is locked onto by a receiver phase-locked loop for the transceiver channel. Subsequently, the interface becomes ready for use while a core of the integrated circuit is becoming operational.

Another embodiment relates to an integrated circuit configured with an interface. The integrated circuit includes a plurality of transceiver channel circuits, an interface processor, and a reset control state machine. Each transceiver channel circuit includes physical coding sublayer circuitry and physical media attachment circuitry, and the physical media attachment circuitry includes a receiver phase-locked loop and a transmitter phase-locked loop. The reset control state machine is arranged to release a calibration start signal that causes the physical media attachment circuitry for the transceiver channel circuits to perform an offset calibration. The reset control state machine is further arranged such that, after receiving an indication that the offset calibration for the transceiver channel circuits is complete, reset signals are released that cause the transmitter and receiver phase-locked loops to lock onto transmitting and receiving frequency signals, respectively.

Another embodiment relates to control circuitry. The control circuitry includes a reset control state machine, a plurality of transceiver channel circuits, a channel input steering multiplexer, and a channel output steering multiplexer. The channel input steering multiplexer is arranged to receive control signals from the reset control state machine and provide a plurality of input signals to the transceiver channel circuits. The channel output steering multiplexer is arranged to monitor outputs of the transceiver channel circuits and to provide control signals to the reset control state machine.

Other embodiments and features are also disclosed.

DETAILED DESCRIPTION

As integrated circuits, such as field programmable gate arrays (FPGAs) and other programmable logic devices (PLDs), become denser and more complex, the time needed to initialize these components is getting longer and longer. If these components are in the critical path of the system initialization, then performance of the system startup tasks may become substantially delayed. For example, activation of an IC-to-IC (chip-to-chip) interface may be on the critical path for system initialization. If so, it becomes highly desirable to reduce a time needed to activate that interface.

In addition, select interface standards require that a link become operational within a certain period of time after power-up. For those interfaces, rapid activation of the interface is needed in order to be compliant with the standard.

Figure 1:
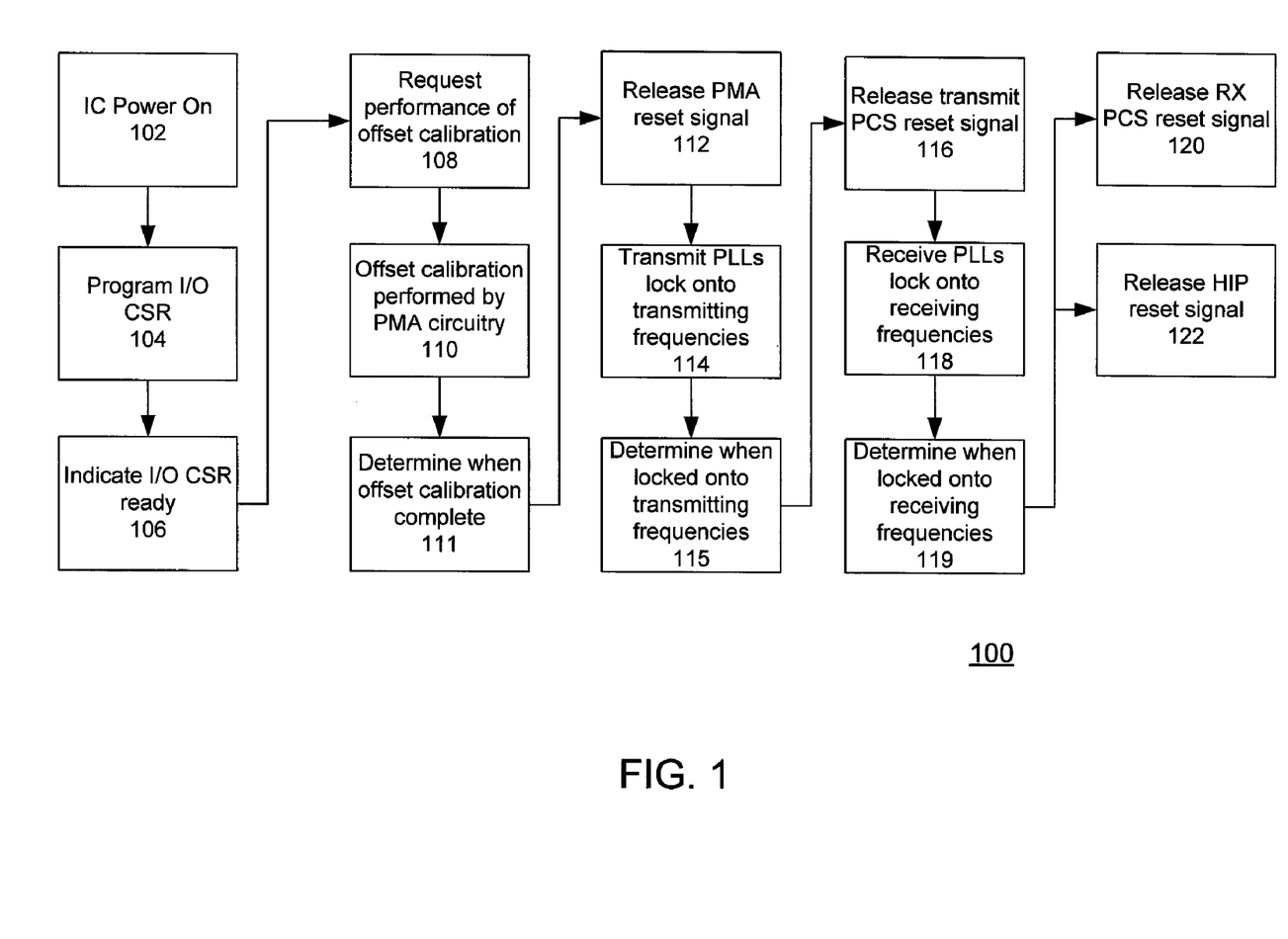
FIG. 1 is a flow chart depicting a method for rapid activation of an interface on an integrated circuit in accordance with an embodiment of the invention.
Figure 2:
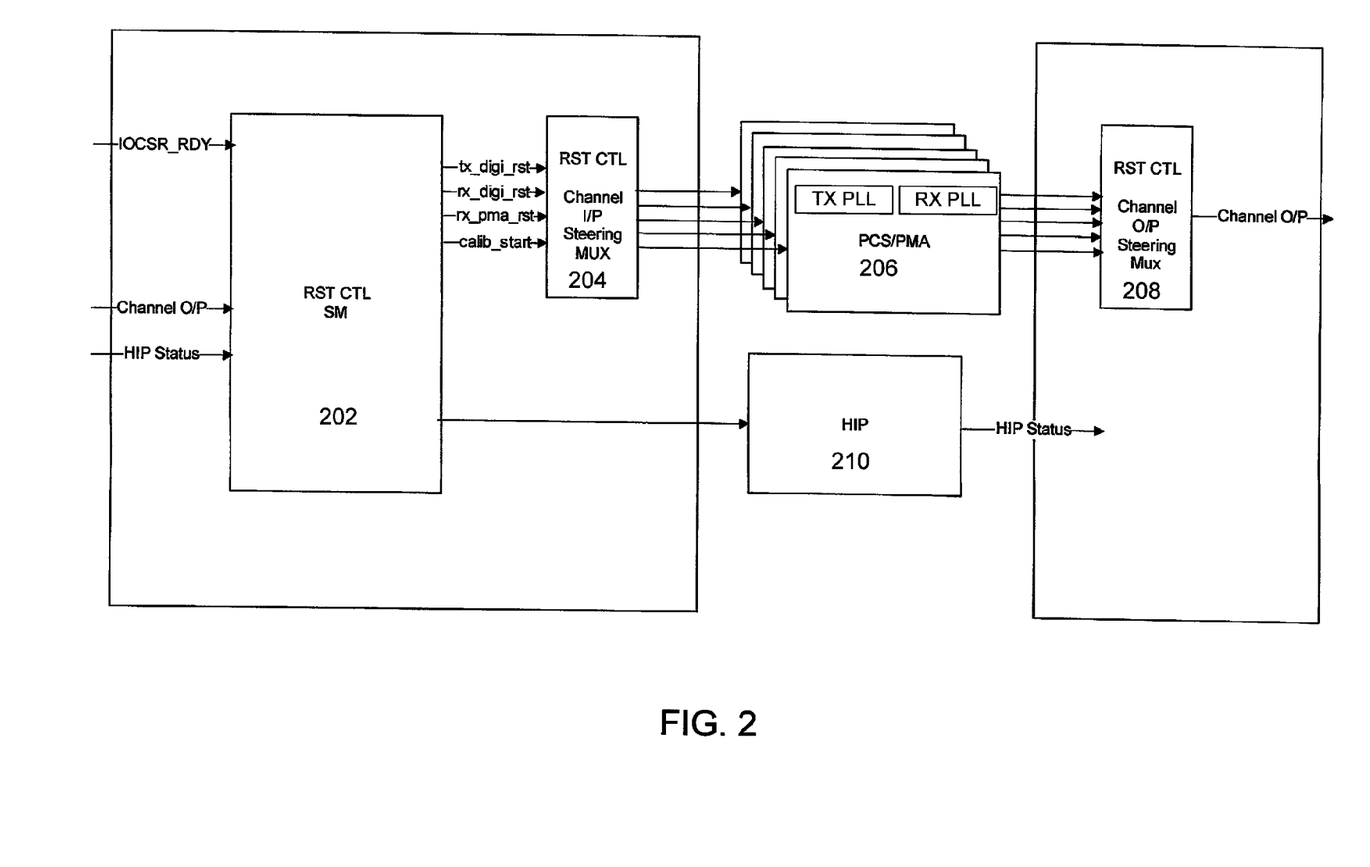
FIG. 2 is a schematic diagram of circuit blocks and signals for providing rapid activation of an interface on an integrated circuit in accordance with an embodiment of the invention.

FIG. 1 is a flow chart depicting a method 100 for rapid activation of an interface on an integrated circuit (IC) in accordance with an embodiment of the invention. FIG. 2 is a schematic diagram of circuit blocks and signals for providing rapid activation of an interface on an integrated circuit in accordance with an embodiment of the invention. The method 100 of FIG. 1 may be performed using the circuit blocks and signals shown in FIG. 2. The circuit blocks in FIG. 2 include a reset control state machine (RST CTL SM) 202, a reset control channel input steering multiplexer (RST CTL Channel UP Steering MUX) 204, physical coding sublayer (PCS) and physical media attachment (PMA) circuitry for multiple channels 206, a reset control channel output steering multiplexer (RST CTL Channel O/P Steering MUX) 208, and a high-speed serial interface (HSSI) interface processor (HIP) 210.

The PCS circuitry generally provides digital logic functions which implement data communication protocols, while the PMA circuitry generally provides mixed (analog/digital) signal functionality for the data communications. For example, for certain protocols, the PCS circuitry may be configured to perform, among other functions, 8-bit (octet) to 10-bit encoding for data to be sent to the PMA circuitry and 10-bit to 8-bit decoding for data received from the PMA circuitry. The PCS circuitry may be arranged into channels, where each channel may process data for a stream of data. The PMA circuitry may be configured to perform, among other functions, serialization of data to be transmitted (conversion from parallel to serial) and de-serialization of received data (conversion from serial to parallel). The PMA circuitry may also be arranged into channels. The PMA circuitry for a channel may include transmit phase-locked loop circuits (TX PLL) and receive PLL circuits (RX PLL).

Referring to FIG. 1, power is applied to the integrated circuit 102. Programming of the input/output configuration shift register (I/O CSR) 104 is then performed. The I/O CSR is a long shift register to facilitate configuration of the integrated circuit. The I/O CSR may be implemented by linking registers in a series of adjacent input/output elements (IOEs) in the integrated circuit. Once the programming of the I/O CSR is complete, an indication may be provided to the reset control state machine 202 that the I/O CSR is ready (IOCSR_RDY) 106.

After receiving the indication that the I/O CSR is ready, the reset control state machine 202 may request 108 that an offset calibration be performed. Making the request may involve sending 109 a calibration start (calib_start) signal to the Channel I/P Steering MUX 204 which may steer the signal to the PCS/PMA circuitry 206. The PMA circuitry for each transceiver channel then performs the offset calibration 110. The offset calibration is performed to improve differential signal quality. By monitoring the output of the PCS/PMA circuitry 206, the Channel O/P Steering MUX 208 determines 111 when the offset calibration is complete for all the channels to be used and may so indicate to the reset control state machine 202 by way of the channel output (Channel O/P) control signals.

Upon receiving the indication that the offset calibration is complete for all channels to be brought up, the reset control state machine 202 may release 112 a PMA reset signal (rx_pma_rst) to the Channel I/P Steering MUX 204. This PMA reset signal may be sent to the Channel I/P Steering MUX 204 which may steer the signal to the PCS/PMA circuitry 206. The transmit phase-locked loop (transmit PLL or TX PLL) for each of the channels then locks onto 114 the transmitting frequency for that channel. By monitoring the output of the PCS/PMA circuitry 206, the Channel O/P Steering MUX 208 determines 115 when the transmitting frequencies have been locked onto. Once the transmitting frequency has been locked onto for all the channels to be brought up, an indication of transmission frequency lock may be sent to the reset control state machine 202 by way of the channel output control signals.

Upon receiving the indication of transmission frequency lock for all channels to be brought up, the reset control state machine 202 may release 116 a transmit PCS (or transmit digital) reset signal (tx_digi_rst) to the Channel I/P Steering MUX 204. This transmit PCS reset signal may be sent to the Channel I/P Steering MUX 204 which may steer the signal to the PCS/PMA circuitry 206. The receive phase-locked loop (receive PLL or RX PLL) for each of the channels then locks onto 118 the receiving frequency for that channel. By monitoring the output of the PCS/PMA circuitry 206, the Channel O/P Steering MUX 208 determines 119 when the receiving frequencies for the channels have been locked onto. After the receiving frequencies have been locked onto for all channels to be brought up, an indication of reception frequency lock is sent to the reset control state machine 202 by way of the channel output control signals.

Upon receiving the indication of reception frequency lock for all channels to be brought up, the reset control state machine 202 may release 120 a receive PCS (or receive digital) reset signal (rx_digi_rst) to the Channel I/P Steering MUX 204. The receive PCS reset signal may be sent to the Channel I/P Steering MUX 204 which may steer the signal to the PCS/PMA circuitry 206. In addition, the reset control state machine 202 may release 122 an HIP reset signal to the HIP 210. At this point, the PMA and PCS circuitry and the HIP are activated and ready to be used.

In other embodiments, the steps shown in FIG. 1 may be performed in different orders. For example, in one embodiment, the receive PLLs may lock onto the receiving frequency signals prior to the transmit PLLs locking onto the transmitting frequency signals. In other words, the flow chart of FIG. 1 may be rearranged so that blocks 118-120 are switched with blocks 114-116.

Figure 3:
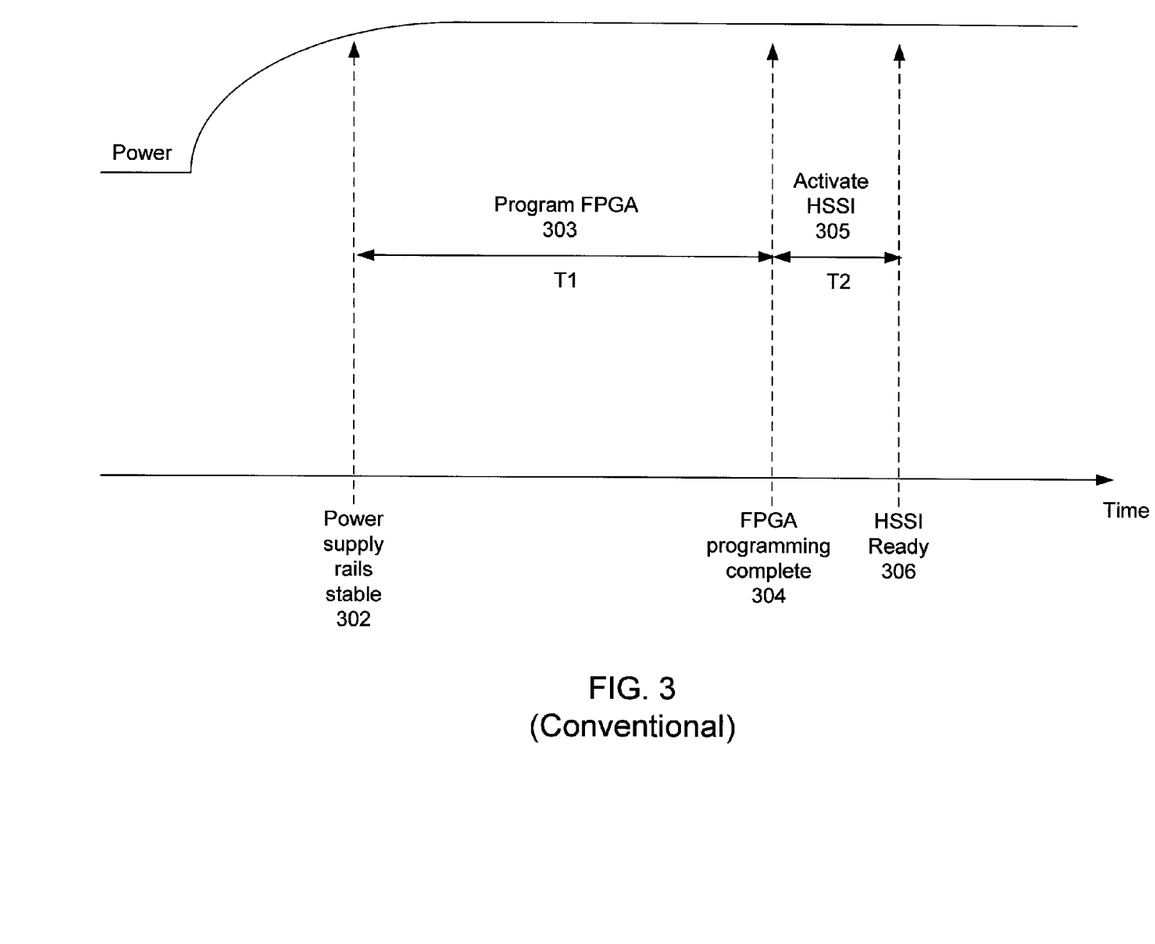
FIG. 3 is a timing diagram relating to the activation of a conventional integrated circuit with a high-speed serial interface.

FIG. 3 is a timing diagram relating to the activation of a conventional integrated circuit with a high-speed serial interface. In this case, the integrated circuit is a field programmable gate array (FPGA). As shown, after power is turned on, there is a first point in time 302 at which the power supply rails are stable.

Thereafter, programming of the FPGA (including its core) occurs 303 until the FPGA programming is complete 304. The time needed to program the FPGA is denoted by time period T1. Thereafter, the HSSI may be activated 305 until the HSSI is ready 306. The time needed to get the HSSI ready is denoted by time period T2. Hence, in this conventional case, it takes a time $T_{conventional} = T1 + T2$ before the HSSI is ready for use.

Figure 4:
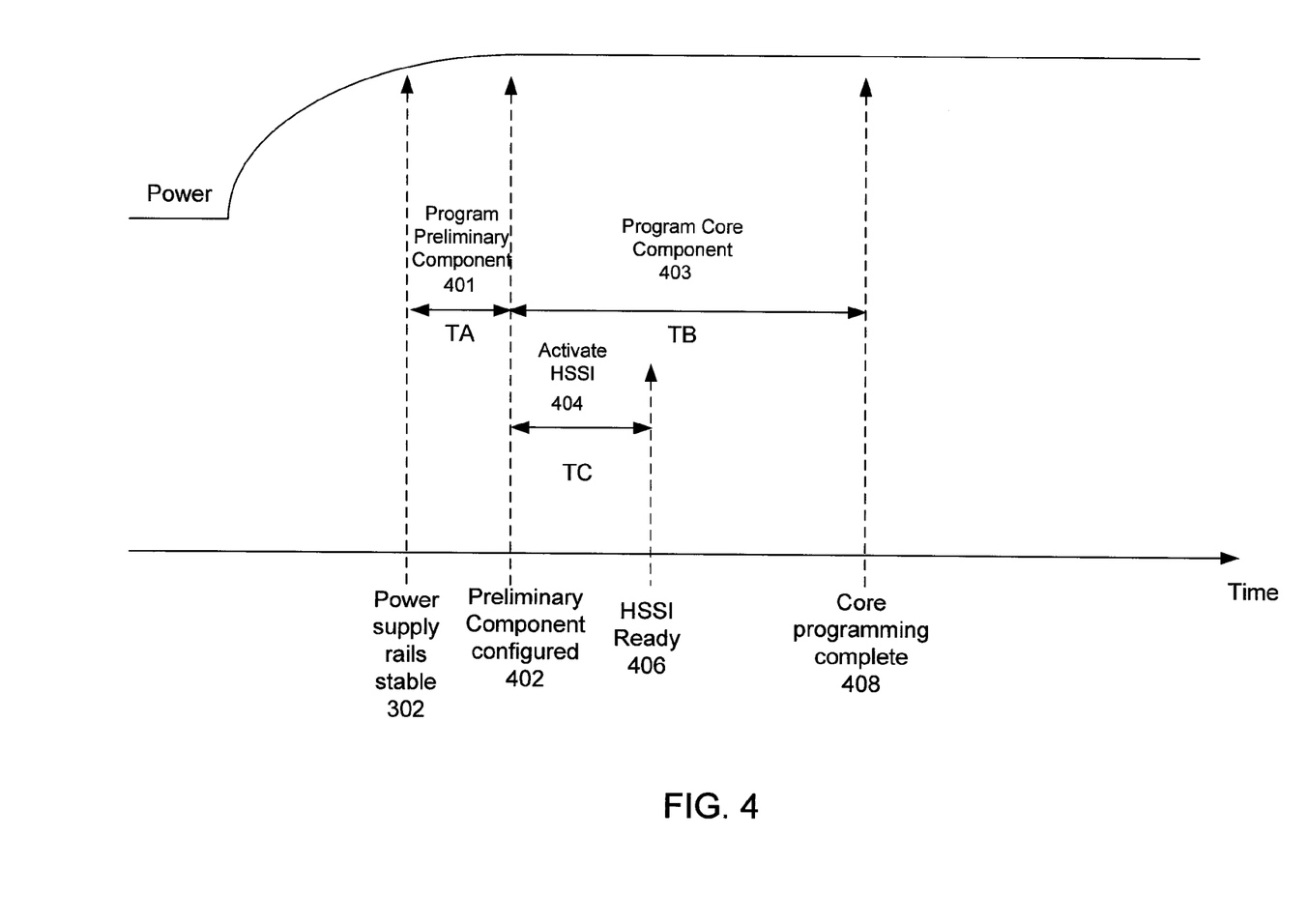
FIG. 4 is a timing diagram relating to the rapid activation of an interface on an integrated circuit in accordance with an embodiment of the invention.

FIG. 4 is a timing diagram relating to the rapid activation of an interface on an integrated circuit in accordance with an embodiment of the invention. In this case, the integrated circuit may be an FPGA or other PLD, although the technique disclosed herein may also be applicable to other types of integrated circuit. For example, the integrated circuit may be a digital signal processor (DSP) with memory that needs to be configured.

As shown, after power is turned on, there is a first point in time 302 at which the power supply rails are stable. Thereafter, programming of a "preliminary" component of the integrated circuit may be performed 401 until that preliminary component is configured 402. Such a preliminary component may need to be programmed prior to the activation of the interface. In one example, the preliminary component 401 may comprise an input/output configuration shift register (IOCSR) which is used to program other portions of the IC. The time needed to program or configure the preliminary component (such as an IOCSR, for example) is denoted by time period TA.

Thereafter, programming of a core component 403 of the IC (such as, for example, a logical core of an FPGA, or configurable memory of a DSP or other type of IC) may be performed. The time needed to program the core component is denoted by time period TB. However, in an unusual twist, instead of waiting for the core programming to be complete, activation of the HSSI proceeds 404 as soon as the preliminary component is configured 402. In other words, programming of the core component 403 and activation of the HSSI 404 are performed in parallel. As such, the HSSI becomes ready for use 406 at a time which is before programming of the core component is complete 408.

Using the technique disclosed herein to bring up the HSSI channels prior to the core being ready turns out to be substantially advantageous. This is because the time to activate the HSSI of TA+TC per the presently-disclosed invention may be substantially shorter than the time needed conventionally of T1+T2. In one particular implementation of the presently-disclosed invention, the time to activate the HSSI of TA+TC is less than one hundred milliseconds, while the core programming time of TB may be greater than one hundred milliseconds.

Figure 5:
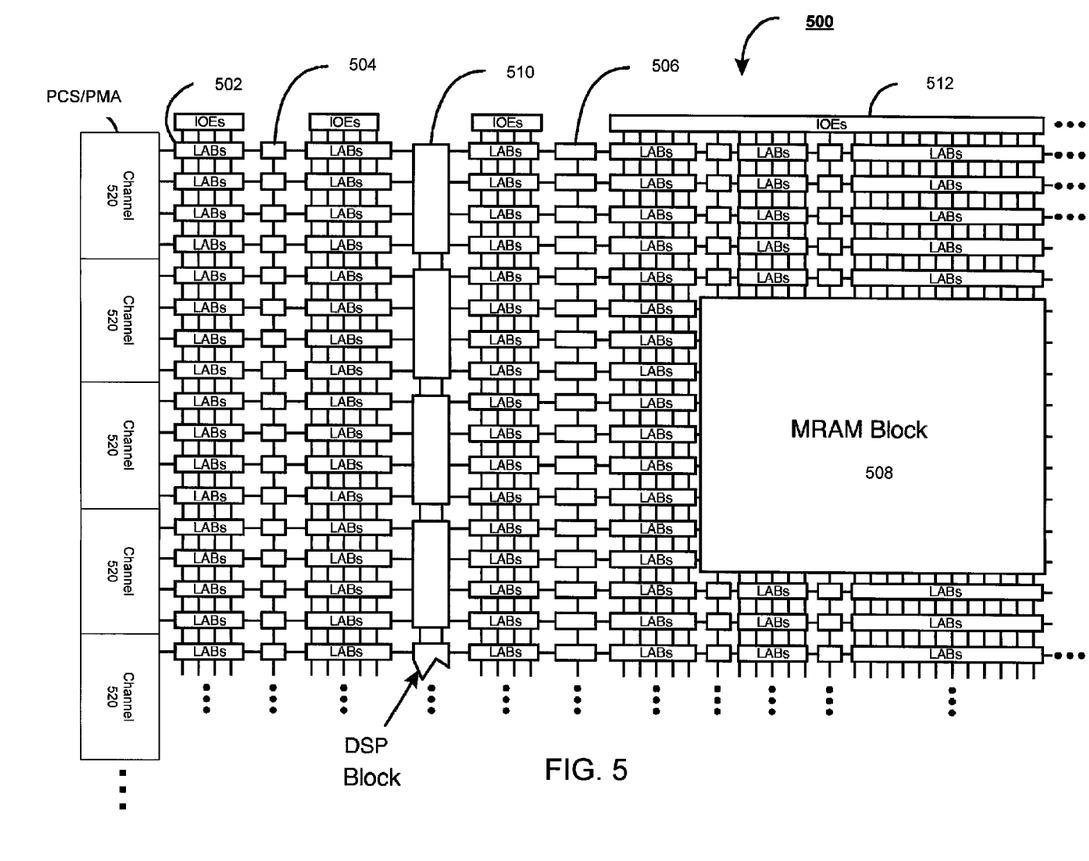
FIG. 5 is a simplified partial block diagram of a field programmable gate array (FPGA) that can include aspects of the present invention.

FIG. 5 is a simplified partial block diagram of a field programmable gate array (FPGA) 500 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 500 includes within its "core" a two-dimensional array of programmable logic array blocks (or LABs) 502 that are interconnected by a network of column and row interconnect conductors of varying length and speed. LABs 502 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 500 also includes a distributed memory structure including random access memory (RAM) blocks of varying sizes provided throughout the array. The RAM blocks include, for example, blocks 504, blocks 506, and block 508. These memory blocks can also include shift registers and FIFO buffers.

FPGA 500 further includes digital signal processing (DSP) blocks 510 that can implement, for example, multipliers with add or subtract features. Input/output elements (IOEs) 512 located, in this example, around the periphery of the chip support numerous single-ended and differential input/output standards. Each IOE 512 is coupled to an external terminal (i.e., a pin) of FPGA 500. As discussed above, registers for a series of adjacent IOEs may be linked to form an IOCSR. The above-discussed PCS/PMA channel array may be arranged as shown, for example, with each PCS/PMA channel circuit 520 being coupled to several LABs. It is to be understood that FPGA 500 is described herein for illustrative purposes only and that the present invention can be implemented in many different types of PLDs, FPGAs, and ASICs.

Figure 6:
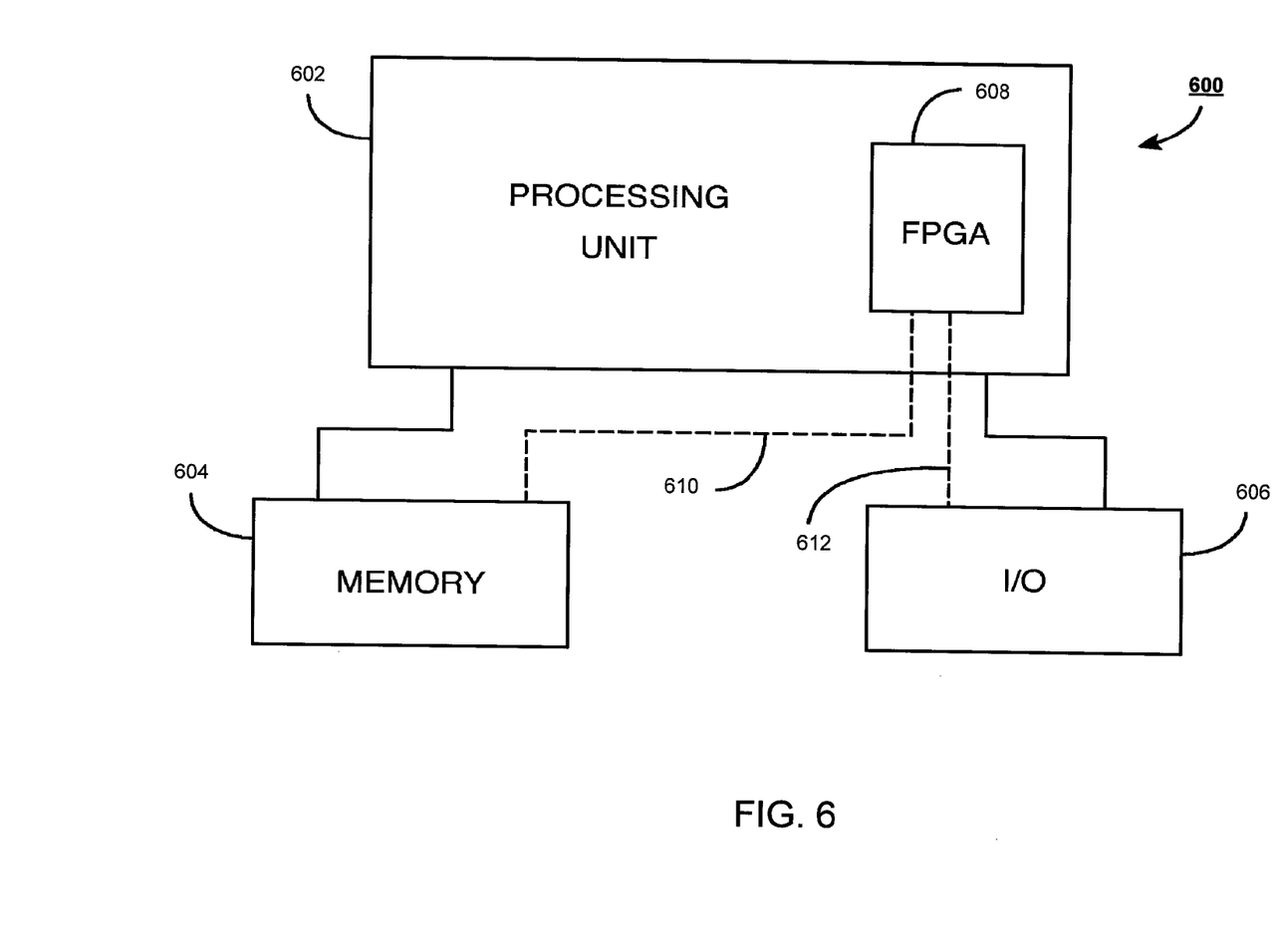
FIG. 6 shows a block diagram of an exemplary digital system that can embody techniques of the present invention.

The present invention can also be implemented in a system that has a FPGA as one of several components. FIG. 6 shows a block diagram of an exemplary digital system 600 that can embody techniques of the present invention. System 600 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 may be provided on a single board, on multiple boards, or within multiple enclosures.

System 600 includes a processing unit 602, a memory unit 604, and an input/output (I/O) unit 606 interconnected together by one or more buses. According to this exemplary embodiment, FPGA 608 is embedded in processing unit 602. FPGA 608 can serve many different purposes within the system in FIG. 6. FPGA 608 can, for example, be a logical building block of processing unit 602, supporting its internal and external operations. FPGA 608 is programmed to implement the logical functions necessary to carry on its particular role in system operation. FPGA 608 can be specially coupled to memory 604 through connection 610 and to I/O unit 606 through connection 612.

Processing unit 602 may direct data to an appropriate system component for processing or storage, execute a program stored in memory 604, receive and transmit data via I/O unit 606, or other similar function. Processing unit 602 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 608 may control the logical operations of the system. As another example, FPGA 608 acts as a reconfigurable processor that may be reprogrammed as needed to handle a particular computing task. Alternately, FPGA 608 may itself include an embedded microprocessor. Memory unit 604 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A method of activation of an interface on an integrated circuit, the method comprising:
    performance of an offset calibration by physical media attachment circuitry for a transceiver channel;
    locking onto a transmitting frequency signal by a transmitter phase-locked loop for the transceiver channel;
    locking onto a receiving frequency signal by a receiver phase-locked loop for the transceiver channel; and
    activation of the interface while a core component of the integrated circuit is becoming operational.

2. The method of claim 1, further comprising, prior to the performance of the offset calibration:
    programming an input/output configuration shift register; and
    receiving a signal indicating that the input/output configuration shift register is ready.

3. The method of claim 1, further comprising, after the offset calibration is completed:
    releasing a signal indicating that the physical media attachment circuitry for the transceiver channel is reset.

4. The method of claim 1, further comprising, after locking onto the transmitting frequency signal:
    releasing a signal indicating that a transmitter physical coding sublayer circuitry for the transceiver channel is reset.

5. The method of claim 1, further comprising, after locking onto the receiving frequency signal:
    releasing a signal indicating that a receiver physical coding sublayer circuitry for the transceiver channel is reset.

6. The method of claim 1, wherein the activation of the interface comprises releasing a signal indicating that an interface processor is reset.

7. The method of claim 1, wherein the integrated circuit comprises a programmable logic device, and the core component comprises a core fabric of the programmable logic device, further wherein the integrated circuit becomes operational after programming of the core fabric is completed.

8. The method of claim 7, wherein the programming the core fabric is completed in over one hundred milliseconds, but the interface is activated in under one hundred milliseconds.

9. The method of claim 1, wherein the core component comprises configurable memory of the integrated circuit, and wherein the integrated circuit becomes operational after programming of the configurable memory is completed.

10. An integrated circuit having an interface, the integrated circuit comprising:
  a plurality of transceiver channel circuits, each transceiver channel circuit including physical coding sublayer circuitry and physical media attachment circuitry, wherein the physical media attachment circuitry includes a receiver phase-locked loop and a transmitter phase-locked loop;
  an interface processor; and
  a reset control state machine which is arranged to
    release a calibration start signal that causes the physical media attachment circuitry for the transceiver channel circuits to perform an offset calibration, and
    after receiving an indication that the offset calibration for the transceiver channel circuits is complete, releasing reset signals that cause the transmitter and receiver phase-locked loops to lock onto transmitting and receiving frequency signals, respectively.

11. The integrated circuit of claim 10, further comprising:
  a channel input steering multiplexer arranged to receive control signals from the reset control state machine and provide a plurality of input signals to the transceiver channel circuits,
  wherein the channel input steering multiplexer is arranged to receive the calibration start signal and said reset signals and to send the calibration start signal and said reset signals to the transceiver channel circuits.

12. The integrated circuit of claim 11, wherein said reset signals include a transmitter reset signal, and wherein the transmitter reset signal is steered by the channel input steering multiplexer to the physical media attachment circuitry in the transceiver channel circuits and initiates locking by the transmitter phase-locked loop onto the transmitting frequency signal.

13. The integrated circuit of claim 11, wherein said reset signals include a receiver reset signal, and wherein the receiver reset signal is steered by the channel input steering multiplexer to the physical media attachment circuitry in the transceiver channel circuits and initiates locking by the receiver phase-locked loop onto the receiving frequency signal.

14. The integrated circuit of claim 10, further comprising:
  a channel output steering multiplexer arranged to monitor outputs of the transceiver channel circuits and to provide control signals to the reset control state machine.

15. The integrated circuit of claim 14, wherein the channel output steering multiplexer is further arranged to determine from the outputs of the transceiver channel circuits when the offset calibration is complete.

16. The integrated circuit of claim 14, wherein the channel output steering multiplexer is further arranged to determine from the outputs of the transceiver channel circuits when the transmitter and receiver phase-locked loops in the transceiver channel circuits have locked onto the transmitting and receiving frequency signals, respectively.

17. The integrated circuit of claim 10, further comprising:
  an input/output configuration shift register,
  wherein the reset control state machine is arranged to send the calibration start signal upon receiving a signal indicating that configuration of the input/output configuration shift register is complete.

18. The integrated circuit of claim 10, wherein the integrated circuit comprises a programmable logic device having a core fabric, and wherein the interface is activated prior to completion of programming of the core fabric.

19. The integrated circuit of claim 18, wherein programming the core fabric is completed in over one hundred milliseconds, but the interface is activated in under one hundred milliseconds.

20. The integrated circuit of claim 10, wherein the integrated circuit comprises a configurable memory, and wherein the interface is activated prior to completion of programming of the configurable memory.

21. Control circuitry comprising:
  a reset control state machine;
  a plurality of transceiver channel circuits;
  a channel input steering multiplexer arranged to receive control signals from the reset control state machine and provide a plurality of input signals to the transceiver channel circuits; and
  a channel output steering multiplexer arranged to monitor outputs of the transceiver channel circuits and to provide control signals to the reset control state machine.

22. The control circuitry of claim 21, wherein the reset control state machine is arranged to release a calibration start signal that causes physical media attachment circuitry for the transceiver channel circuits to perform an offset calibration, and, after receiving an indication that the offset calibration for the transceiver channel circuits is complete, to release reset signals that cause transmitter and receiver phase-locked loops to lock onto transmitting and receiving frequency signals, respectively.

* * * * *